(12) United States Patent
Tsai et al.

(10) Patent No.: US 10,573,749 B2
(45) Date of Patent: Feb. 25, 2020

(54) FIN-TYPE FIELD EFFECT TRANSISTOR STRUCTURE AND MANUFACTURING METHOD THEREOF

(71) Applicant: Taiwan Semiconductor Manufacturing Co., Ltd., Hsinchu (TW)

(72) Inventors: Chun Hsiung Tsai, Hsinchu County (TW); Ziwei Fang, Hsinchu (TW); Shiu-Ko JangJian, Tainan (TW); Kei-Wei Chen, Tainan (TW); Huai-Tei Yang, Hsinchu (TW); Ying-Lang Wang, Tai-Chung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 345 days.

(21) Appl. No.: 15/054,089

(22) Filed: Feb. 25, 2016

(65) Prior Publication Data

US 2017/0250281 A1 Aug. 31, 2017

(51) Int. Cl.
*H01L 27/01* (2006.01)
*H01L 29/78* (2006.01)
(Continued)

(52) U.S. Cl.
CPC .. *H01L 29/7848* (2013.01); *H01L 21/823418* (2013.01); *H01L 21/823431* (2013.01);
(Continued)

(58) Field of Classification Search
CPC ............... H01L 29/7848; H01L 29/161; H01L 29/6653; H01L 29/66545; H01L 21/823418; H01L 21/823431; H01L 21/823458; H01L 27/1211; H01L 29/41791; H01L 21/823821; H01L 29/785–29/7856; H01L 29/16–29/1608; H01L 29/66795–29/66818; H01L 29/66; H01L 29/66553; H01L 29/6656; H01L 21/82346; H01L 29/7851;
(Continued)

(56) References Cited

U.S. PATENT DOCUMENTS 9,064,890 B1 * 6/2015 Xie .................... H01L 21/82343
9,093,478 B1 * 7/2015 Cheng ................. H01L 29/6681
(Continued)

FOREIGN PATENT DOCUMENTS

WO     WO 2015147842 A1 * 10/2015     ....... H01L 29/66795

*Primary Examiner* — Jarrett J Stark
(74) *Attorney, Agent, or Firm* — JCIPRNET

(57) ABSTRACT

A fin-type field effect transistor comprising a substrate, at least one gate structure, first spacers, second spacers and source and drain regions is described. The substrate has fins and insulators disposed between the fins. The at least one gate structure is disposed over the fins and disposed on the insulators. The first spacers are disposed on opposite sidewalls of the at least one gate structure. The source and drain regions are disposed on two opposite sides of the at least one gate structure and beside the first spacers. The second spacers are disposed on the two opposite sides of the at least one gate structure and beside the first spacers. The source and drain regions are sandwiched between the opposite second spacers.

20 Claims, 8 Drawing Sheets

(51) Int. Cl.
  *H01L 27/12*       (2006.01)
  *H01L 21/8234*     (2006.01)
  *H01L 29/66*       (2006.01)
  *H01L 29/161*      (2006.01)
  *H01L 29/16*       (2006.01)
  *H01L 29/165*      (2006.01)

(52) U.S. Cl.
  CPC .. *H01L 21/823468* (2013.01); *H01L 27/1211* (2013.01); *H01L 29/161* (2013.01); *H01L 29/1608* (2013.01); *H01L 29/6653* (2013.01); *H01L 29/66545* (2013.01); *H01L 29/66795* (2013.01); *H01L 29/785* (2013.01); *H01L 29/165* (2013.01)

(58) Field of Classification Search
  CPC . H01L 29/7853–7854; H01L 29/66803; H01L 29/7855–7856; H01L 2029/7858; H01L 27/10879; H01L 27/10826; H01L 27/0924; H01L 27/0886; H01L 21/845; H01J 2237/334–3348; H01J 21/02071; H01J 21/32136–32137; H01J 21/31138; H01J 21/31122; H01J 21/31116; H01J 21/3065–30655; C23F 1/32–40; C23F 1/16–30; C23F 1/00–46; C23F 21/465; C23F 21/31133–31138; C23F 21/32133–32139; C23F 21/31111–31122; C23F 21/31055–31056; C23F 21/3063–30635; C23F 21/30604–30621; C23F 21/02019
  USPC .................................. 438/303, 230; 257/347
  See application file for complete search history.

(56) References Cited

U.S. PATENT DOCUMENTS

| | | | | |
|---|---|---|---|---|
| 9,391,202 | B2* | 7/2016 | Park | H01L 29/785 |
| 9,425,318 | B1* | 8/2016 | Hoentschel | H01L 29/7851 |
| 2007/0045729 | A1* | 3/2007 | Hoentschel | H01L 21/823814 257/344 |
| 2014/0080276 | A1* | 3/2014 | Brand | H01L 29/66803 438/283 |
| 2014/0264604 | A1* | 9/2014 | Tsai | H01L 29/785 257/347 |
| 2014/0264607 | A1* | 9/2014 | Basu | H01L 29/785 257/365 |
| 2014/0273397 | A1* | 9/2014 | Rodder | H01L 21/76 438/400 |
| 2014/0346600 | A1* | 11/2014 | Cheng | H01L 29/7849 257/347 |
| 2014/0367800 | A1* | 12/2014 | Lee | H01L 27/12 257/402 |
| 2015/0091099 | A1* | 4/2015 | Ching | 257/401 |
| 2016/0148936 | A1* | 5/2016 | Xu | H01L 27/0924 257/369 |
| 2016/0268434 | A1* | 9/2016 | Ching | H01L 29/7851 |
| 2016/0315172 | A1* | 10/2016 | Wu | H01L 29/0847 |
| 2017/0033105 | A1* | 2/2017 | Wang | H01L 27/0924 |
| 2018/0033626 | A1* | 2/2018 | Liao | H01L 29/785 |
| 2018/0261694 | A1* | 9/2018 | Dewey | H01L 29/778 |

* cited by examiner

FIN-TYPE FIELD EFFECT TRANSISTOR STRUCTURE AND MANUFACTURING METHOD THEREOF

BACKGROUND

Relative to planar MOS structures, new generations of three-dimensional fin-type field effect transistors (FinFETs) have been actively developed following the trend of scaling down the size of the semiconductor devices. As the gate electrode is often located above the channel region for the planar transistor, the gate electrode wrapping around the channel from three sides in FinFETs provides better electrical control over the channel. While the size of the semiconductor device keeps decreasing, the fin arrangement becomes tightened and the gate pitch is reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
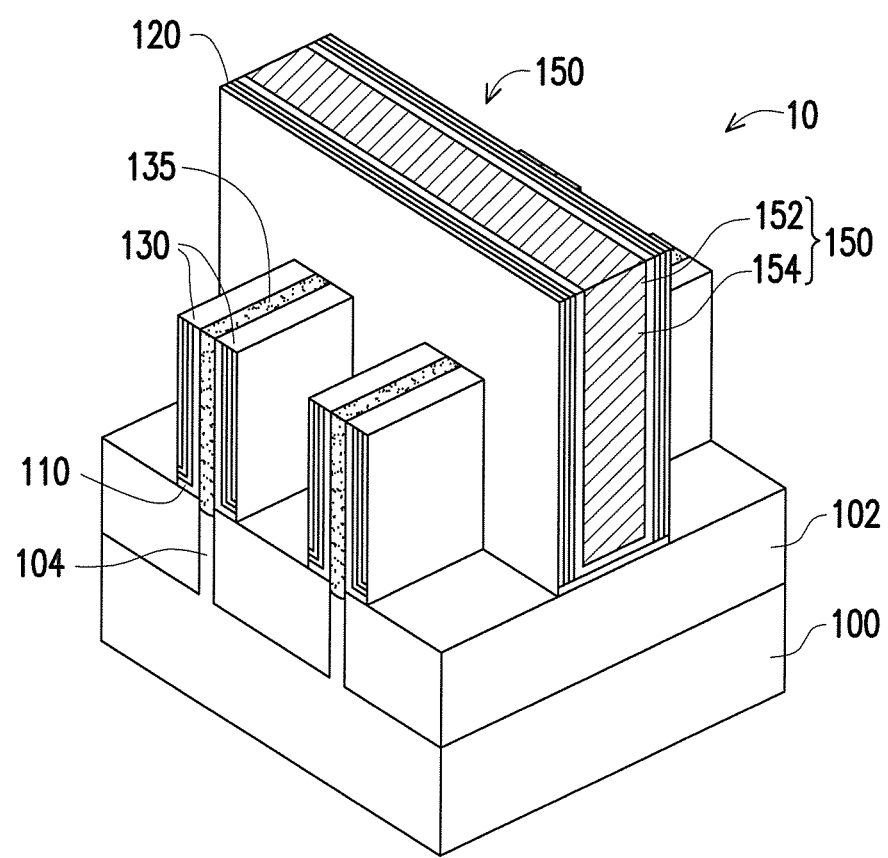
FIG. 1 is a perspective view of a portion of an exemplary FinFET device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FinFETs and the FinFETs fabricated there-from. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are intended to provide further explanations but are not used to limit the scope of the present disclosure.

FIG. 1 illustrates a perspective view of a portion of an exemplary FinFET device in accordance with some embodiments of the present disclosure. In FIG. 1, the FinFET device 10 comprises at least one gate structure 150 formed on a substrate 100, first spacers 120 formed on opposite sidewalls of the gate structure 150, source and drain regions 135 located beside the first spacers 120 and at two opposite sides of the gate structure 150, and second spacers 130 formed on opposite sidewalls of the source and drain regions 135. In some embodiments, the FinFET device 10 is a p-type FinFET device. In some embodiments, the FinFET device 10 is an n-type FinFET device. In certain embodiments, the substrate 100 includes insulators 102 and fins 104 located between the insulators 102, and the extending direction of the gate structure 150 is perpendicular to the extending direction of the fins 104. In some embodiments, the source and drain regions 135 located beside the first spacers 120 and the gate structure 150 are strained source and drain regions. In some embodiments, the gate structure 150 is a replacement metal gate structure.

Figure 2A:
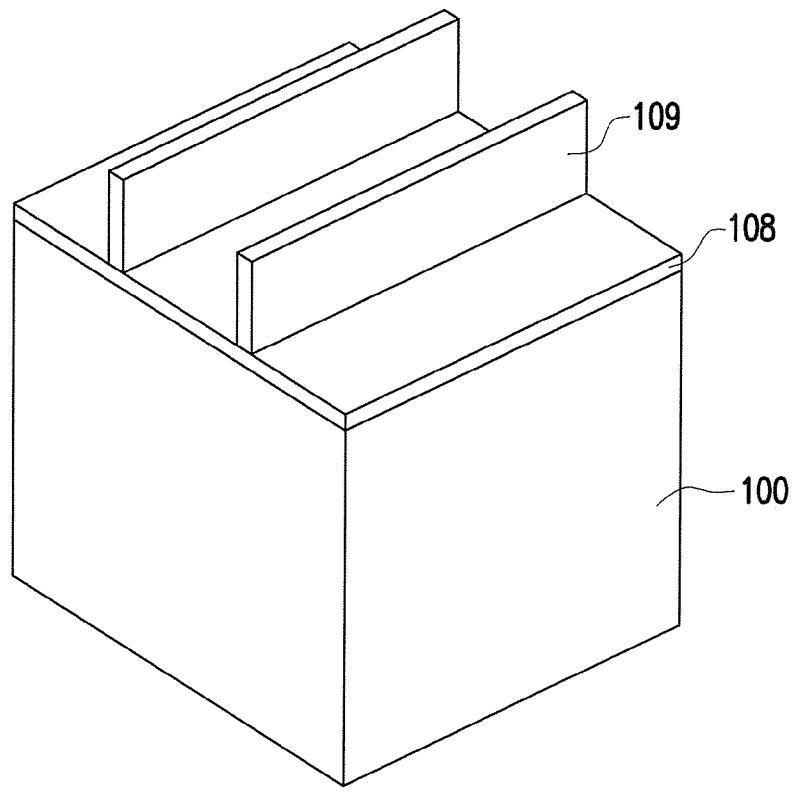
FIGS. 2A-2K are the perspective views and cross-sectional views showing the FinFET at various stages of the manufacturing method for forming a FinFET according to some embodiments of the present disclosure.

FIGS. 2A-2K illustrate the perspective views and cross-sectional view of a portion of the FinFET device 10 at various stages of the manufacturing methods for forming a FinFET device according to some embodiments of the present disclosure. In FIG. 2A, a substrate 100 is provided. A mask layer 108 is formed over the substrate 100 and a photosensitive pattern 109 is formed on the mask layer 108 and over the substrate 100. In one embodiment, the mask layer 108 is a silicon nitride layer formed by, for example, chemical vapor deposition (CVD). In some embodiments, the substrate 100 is a bulk silicon substrate or a bulk germanium substrate. Depending on the requirements of design, the bulk silicon substrate may be a p-type substrate or an n-type substrate and comprise different doped regions. The doped regions may be configured for an n-type FinFET or a p-type FinFET.

Figure 2B:
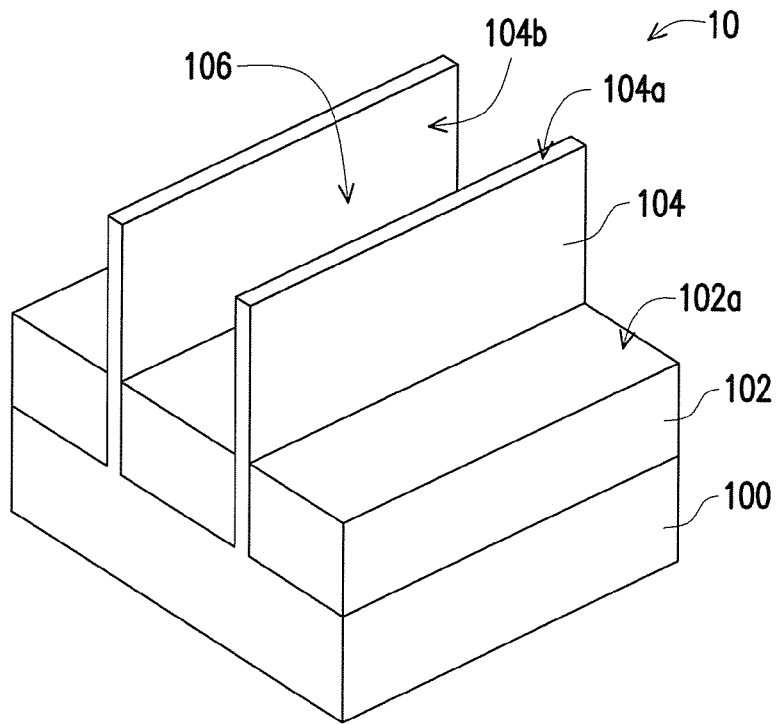

FIG. 2B is a perspective view of the FinFET 10 at one of various stages of the manufacturing method. As shown in FIG. 2B, the substrate 100 is patterned to form trenches 106 in the substrate 100 and the fins 104 are formed between the trenches 106 by etching into the substrate 100, using the photosensitive pattern 109 and the mask layer 108 as etching masks. In some embodiments, the trenches 106 are strip-shaped and arranged in parallel. Then, insulators 102 are formed within the trenches 106. In certain embodiments, the trenches 106 are filled with an insulating material (not shown) and the insulating material filled in the trenches 106 between the fins 104 is then partially removed by an etching process. In some embodiments, the insulating material includes silicon oxide, silicon nitride, silicon oxynitride, a spin-on dielectric material, or a low-k dielectric material. The insulating material is formed by chemical vapor deposition (CVD) or by spin-on, for example. In one embodiment, the etching process is performed by using a wet etching process with hydrofluoric acid (HF). In another embodiment, the etching process is performed by using a dry etching process. In one embodiment, the remained mask layer 108 and the photosensitive pattern 109 are removed. The insulating material remained within the trenches 106 becomes insulators 102 with their top surfaces 102a lower than the top surfaces 104a of the fins 104. Upper portions of the fins 104 protrude from the top surfaces 102a of the insulators 102.

Figure 2C:
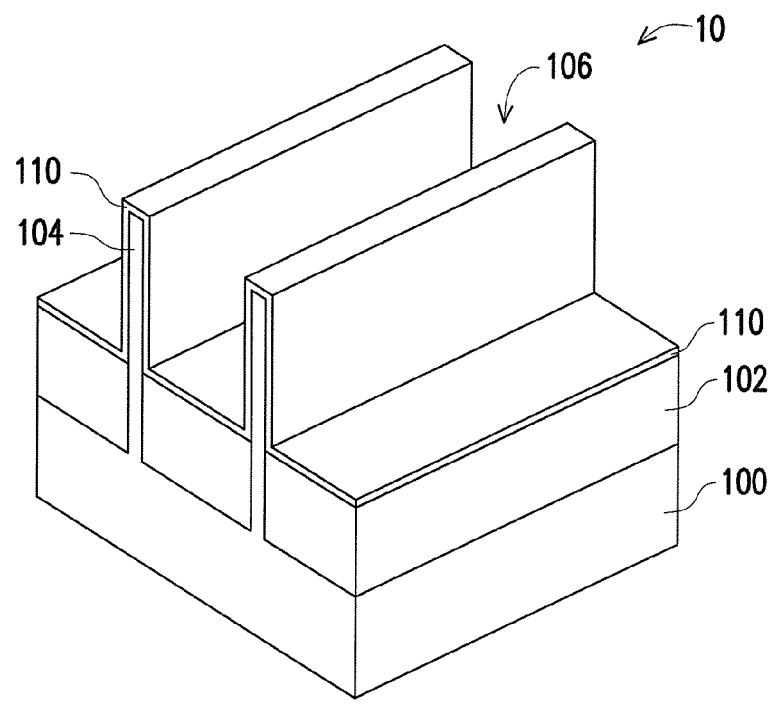

FIG. 2C is a perspective view of the FinFET 10 at one of various stages of the manufacturing method. Thereafter, in FIG. 2C, in some embodiments, a pad layer 110 is optionally formed over the substrate 100, conformally covering the fins 104 and covers the top surfaces 104a of the fins 104 and sidewalls 104b of the protruded portions of the fins 104 and conformally covering the insulators 102 in the substrate 100. The pad layer 110 includes silicon oxide formed by thermal oxidation, for example.

Figure 2D:
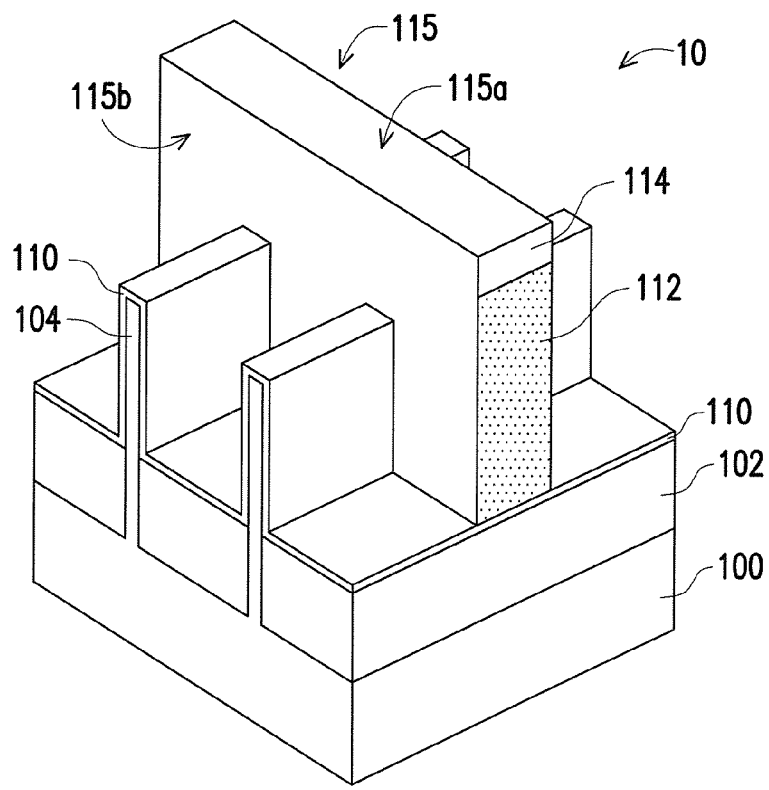

FIG. 2D is a perspective view of the FinFET 10 at one of various stages of the manufacturing method. In FIG. 2D, a stack structure 115 is formed over the substrate 100 and on the insulators 102, and across the fins 104 (over the upper portions of the fins 104). In FIG. 2D, one stack structure is shown, and the number of the stack structure(s) 115 is merely for illustrative purposes but may be more than one, depending on the designs of the device structure of the present disclosure. In some embodiments, the stack structures 115 are strip-shaped and arranged in parallel, and the extending direction of the strip-shaped stack structures is perpendicular to the extending direction (length direction) of the fins 104. The stack structure 115 comprises a polysilicon strip 112, a hard mask strip 114 located on the polysilicon strip 112. In at least one embodiment, the stack structure 115 covers the upper portions of the fins 104. In some embodiments, the stack structure 115 is formed by depositing a polysilicon layer (not shown), forming a hard mask layer (not shown) over the polysilicon layer and then patterning the hard mask layer and the polysilicon layer to form the polysilicon strip 112 and the hard mask strip 114. In one embodiment, the polysilicon layer is formed by CVD, for example. In one embodiment, the material of the hard mask layer includes silicon oxide, silicon nitride, silicon oxynitride or the combination thereof. In one embodiment, the hard mask layer is formed by CVD or physical vapor deposition (PVD). The patterning of the hard mask layer and the polysilicon layer includes performing one or more anisotropic etching processes, for example. In certain embodiments, the stack structure(s) 115 functions as the dummy strip(s), which defines the location(s) of the subsequently formed replacement gate structure(s).

Figure 2E:
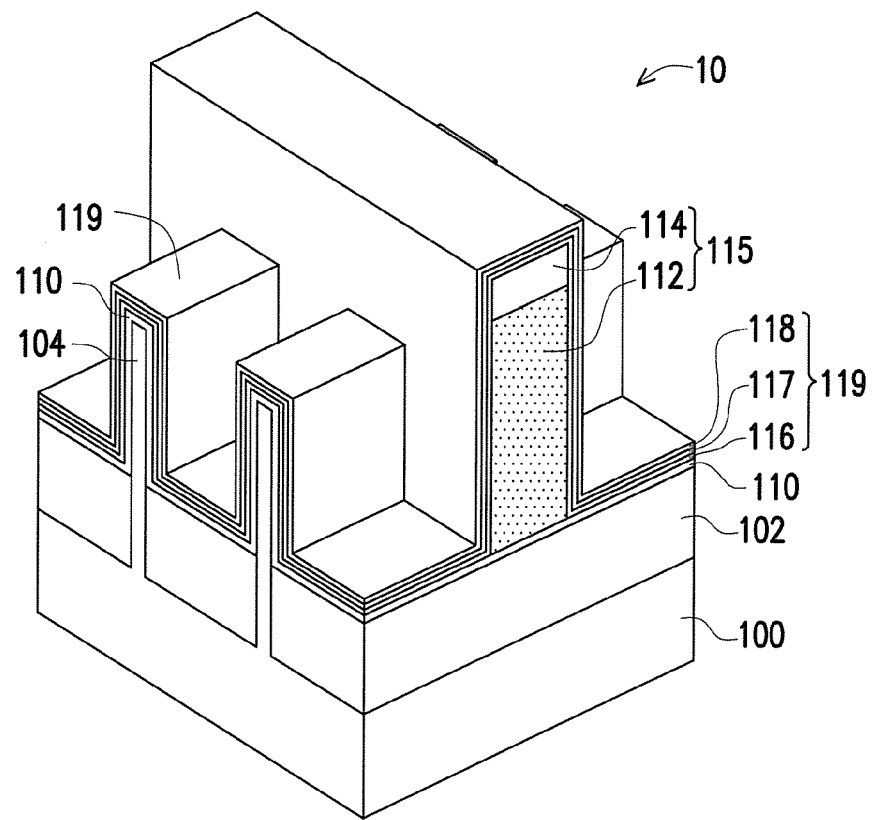

FIG. 2E is a perspective view of the FinFET 10 at one of various stages of the manufacturing method. In FIG. 2E, a first spacer material 116, a second spacer material 117 and a third spacer material 118 are sequentially formed on the pad layer 110 and are formed as blanket layers over the substrate 100, conformally covering the protruded portions of the fins 104 and the stack structure(s) 115. That is, the first spacer material 116, the second spacer material 117 and the third spacer material 118 cover the top surfaces 104a and sidewalls 104b of the fins 104, and cover the top surface 115a and sidewalls 115b of the stack structure 115. In some embodiments, the materials of the first spacer material 116, the second spacer material 117 and the third spacer material 118 are all different or are different in part. The materials of the first spacer material 116, the second spacer material 117 and the third spacer material 118 include silicon nitride, silicon oxide, silicon oxynitride, silicon carbon oxynitride (SiCON), silicon carbonitride (SiCN) or combinations thereof. The multi-layered structure of the first spacer material 116, the second spacer material 117 and the third spacer material 118 is considered as a dielectric spacer material layer 119. Although the dielectric spacer material layer 119 is described to include three layers of dielectric materials in certain embodiments of the present disclosure, the dielectric spacer material layer 119 may be a single layer or a multi-layered structure in alternative embodiments of the present disclosure.

Figure 2F:
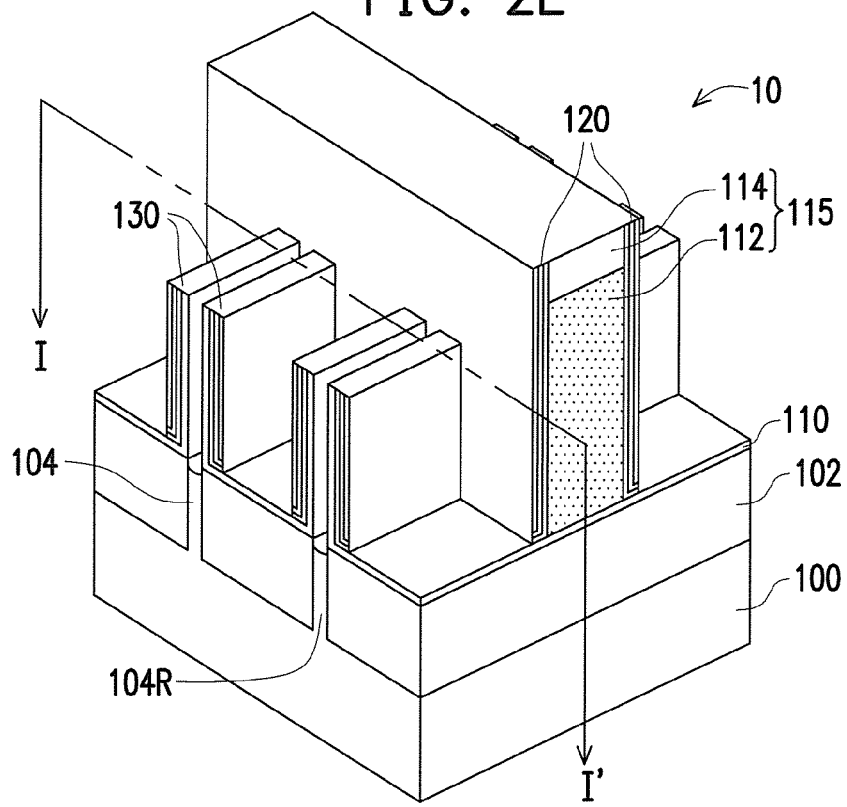
Figure 2G:
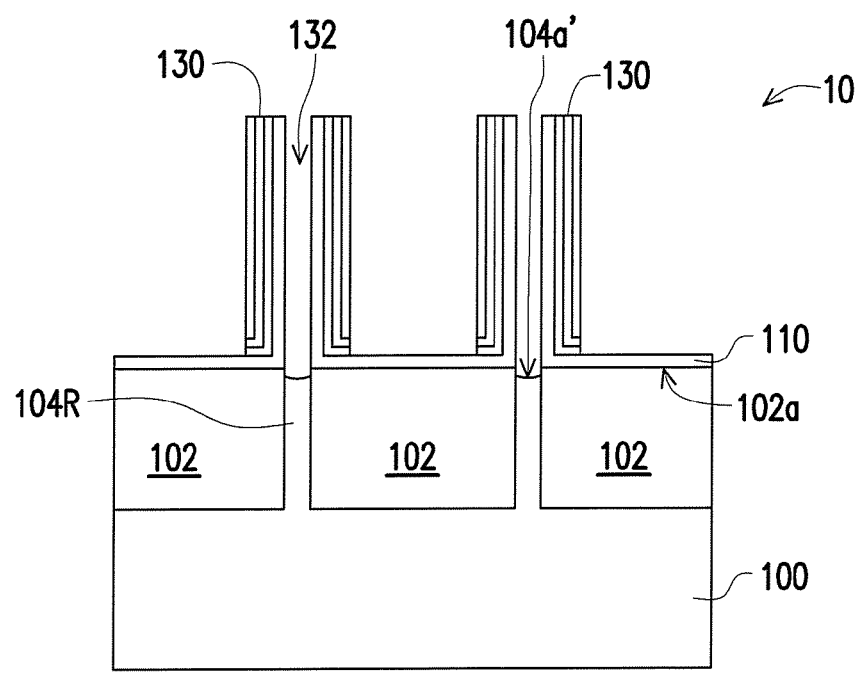

FIG. 2F is a perspective view of the FinFET 10 at one of various stages of the manufacturing method. FIG. 2G is an exemplary cross-sectional view of FIG. 2F along the cross-sectional line I-I'. In FIG. 2F & FIG. 2G, in some embodiments, a selective etching process is performed to form the first spacers 120 and the second spacers 130. In certain embodiments, the individual first spacer 120 or the individual second spacer 130 is a three-layered structure including a seal spacer, an offset spacer and a dummy spacer. During the selective etching process, in certain embodiments, the first spacers 120 are formed on the sidewalls 115b of the stack structure 115 (on the sidewalls of the hard mask strip 114 and the polysilicon strip 112) by removing the dielectric spacer material layer 119 (the first spacer material 116, the second spacer material 117 and the third spacer material 118) on the top surface 115a of the stack structure 115 and leaving the dielectric spacer material layer 119 remained on the sidewalls 115b of the stack structure 115 to become the first spacers 120. In some embodiments, during the selective etching process, the second spacers 130 are simultaneously formed beside the fins 104, by removing the dielectric spacer material layer 119 (the first spacer material 116, the second spacer material 117 and the third spacer material 118) on the top surfaces 104a of the fins 104 and leaving the dielectric spacer material layer 119 remained on the sidewalls 104b of the fins 104 to become the second spacers 130. In one embodiment, the optionally formed pad layer 110 on the top surfaces 104a of the fins 104 is removed during the selective etching process, leaving the pad layer 110 located between the second spacers 130 and the sidewalls 104b of the fins 104.

In FIG. 2F & FIG. 2G, in certain embodiments, during the selective etching process, following the removal of the pad layer 110, the dielectric spacer material layer 119 (the first spacer material 116, the second spacer material 117 and the third spacer material 118) on the top surfaces 104a of the fins 104, the fins 104 are exposed and the upper portions of the fins 104 are removed to form recesses 132 between the second spacers 130. In certain embodiments, the fins 104 located beside the stack structure 115 (not covered by the stack structure 115) and between the second spacers 130 are recessed during the selective etching process. In one embodiment, as shown in FIG. 2G, the top surface 104a' of the remained fins 104 (the recessed portions 104R) is slightly below the top surface 102a of the insulator 102. In alternative embodiments, the top surface 104a' of the remained fins 104 may be substantially coplanar with or slightly above the top surface 102a of the insulator 102. In some embodiments, the selective etching process includes at least one atomic layer etching (ALE) process or at least one quasi-ALE process. In one embodiment, the ALE process or the quasi-ALE process is performed to strip off the dielectric spacer material layer 119 by mono atomic-layer or one or several atomic-layers of the dielectric spacer material layer 119. Depending on the material(s) of the dielectric spacer material layer 119, one or more etchants may be used and the etchant(s) of the ALE process or the quasi-ALE process may be adjusted or changed for suitable etching selectivity. In certain embodiments, the ALE process or the quasi-ALE process includes using fluorocarbons as the etchant. In one embodiment, the ALE process or the quasi-ALE process includes performing anisotropic etching processes using tetra-methyl-ammonium hydroxide (TMAH) or hydrofluoric acid (HF). In certain embodiment, due to the etching selectivity between the silicon of the fins and the material(s) of the dielectric spacer material layer 119, the height of the second spacers 130 may be a few nanometers (e.g. 2-5 nm) lower than the original height of the dielectric spacer material layer 119 (i.e. the original height of the fins 104). Optionally, a gradient implantation process may be performed to the remained fins 104 to adjust the resistance.

Figure 2H:
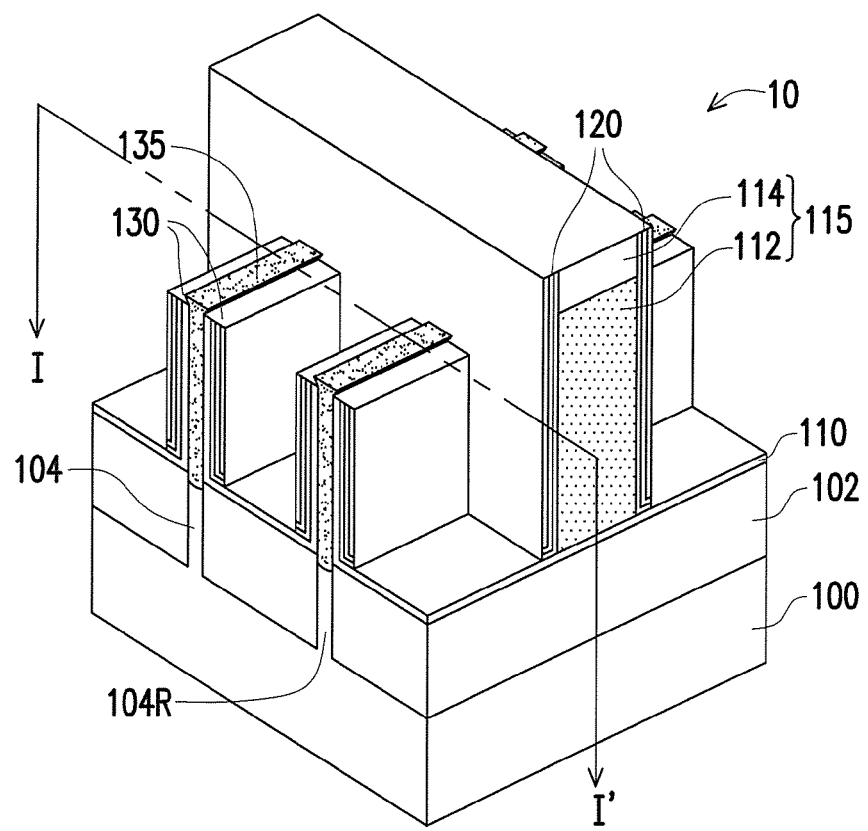
Figure 2I:
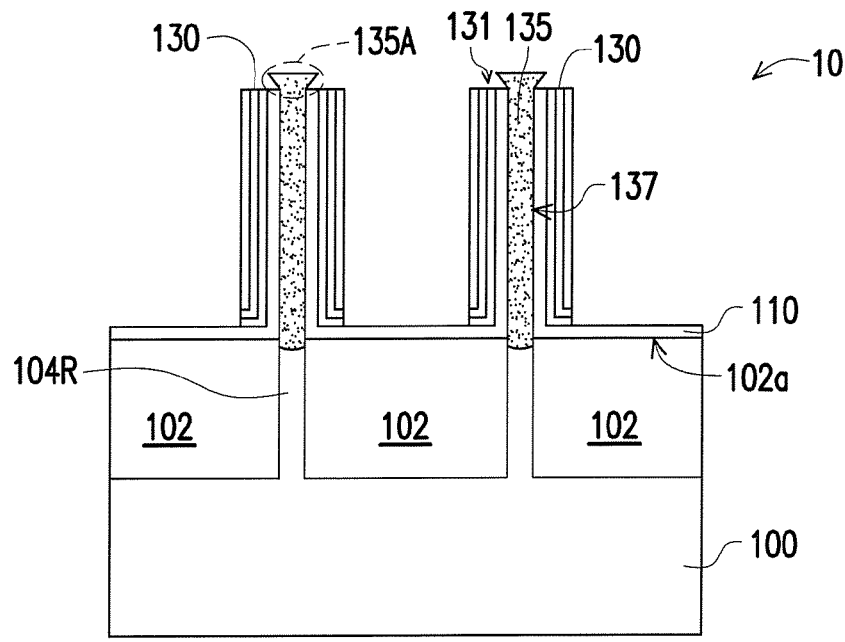

FIG. 2H is a perspective view of the FinFET 10 at one of various stages of the manufacturing method. FIG. 2I is an exemplary cross-sectional view of FIG. 2H along the cross-sectional line I-I'. In FIG. 2H & FIG. 2I, in some embodiments, after forming the second spacers 130 and removing the portions of the fins 104 between the second spacers 130 to form the recesses 132, the source and drain regions 135 are formed within the recesses 132 and between the opposite second spacers 130. As shown in FIG. 2H, the source and drain regions 135 are sandwiched between two opposite second spacers 130. In other words, the second spacers 130 (and the optional pad layer 110) are located on the sidewalls 137 of the source and drain regions 135. The formed source and drain regions 135 are located at opposite sides of the stack structure 115 and beside the first spacers 120 located on the sidewalls 115b of the stack structure 115. In certain embodiments, the source and drain regions 135 are formed by filling an epitaxy material into the recesses 132 between the second spacers 130. That is, the source and drain regions 135 are located on the recessed portions 104R of the fins 104 and between the second spacers 130. In some embodiments, the epitaxy material includes a germanium-containing material, such a silicon germanium (SiGe), boron-doped silicon germanium (SiGeB) or a carbon-containing material such as silicon carbide (SiC), phosphorous-doped silicon carbide (SiCP) or silicon phosphide (SiP). In some embodiments, the source and drain regions 135 are formed through epitaxial growth technology, using gaseous or liquid precursors. For example, the epitaxial growth technology includes liquid phase epitaxy, hydride vapor phase epitaxy, cyclic deposition-etch (CDE) epitaxy or selective epitaxial growth (SEG). In certain embodiments, in-situ doping process is performed along with the epitaxial growth process, to form the epitaxy material of high crystal quality for the source and drain regions 135. In some embodiments, the source and drain regions 135 are formed by forming the epitaxy material to fill up the recesses 132 through performing a SEG process with in-situ doping. In certain embodiments, dopants within the in-situ doping epitaxy material filled in the recesses 132 diffuse into the fins 104, thus increasing the doping concentration within the fins. Through the formation of the epitaxy material with suitable doping concentrations in the source and drain regions, the fins can be properly doped to achieve sufficient doping concentration of the fins for lower resistance or for adjusting the resistance of the fins.

In FIG. 2H & FIG. 2I, in certain embodiments, some of the epitaxy material of the source and drain regions 135 filled within the recesses is protruded out from the top surfaces 131 of the second spacers 130. In some embodiments, optionally, the epitaxy material is allowed to slightly over-grow and the epitaxy material is protruded from the top surfaces 131 of the second spacers 130 for a few nanometers (e.g. 2-5 nm), thus compensating the height loss during the etching of the dielectric spacer material layer 119. Due to the existence of the second spacers 130, as shown in FIG. 2I, the epitaxy material is slightly over-grown but the protruded portions 135A of the epitaxy material filled in the adjacent recesses 132 will not merge or contact each other, which leads to controlled and uniform growth of the epitaxy material. As the source and drain regions 135 are sandwiched between the second spacers 130, the source and drain regions 135 located on the different fins 104 keep a distance from one another and are separate from one another. Since the lattice constant of the epitaxy material or the in-situ doping epitaxy material filled within the recesses 132 is different from the material of the fins 104, the channel region is strained or stressed to increase carrier mobility of the device and enhance the device performance. The source and drain regions 135 located between the opposite second spacers 130 and at two opposite sides of the stack structure 115 are strained source and drain regions. In some embodiments, the source and drain regions 135 are optionally ion implanted and/or silicide layers (not shown) are formed by silicidation.

Figure 2J:
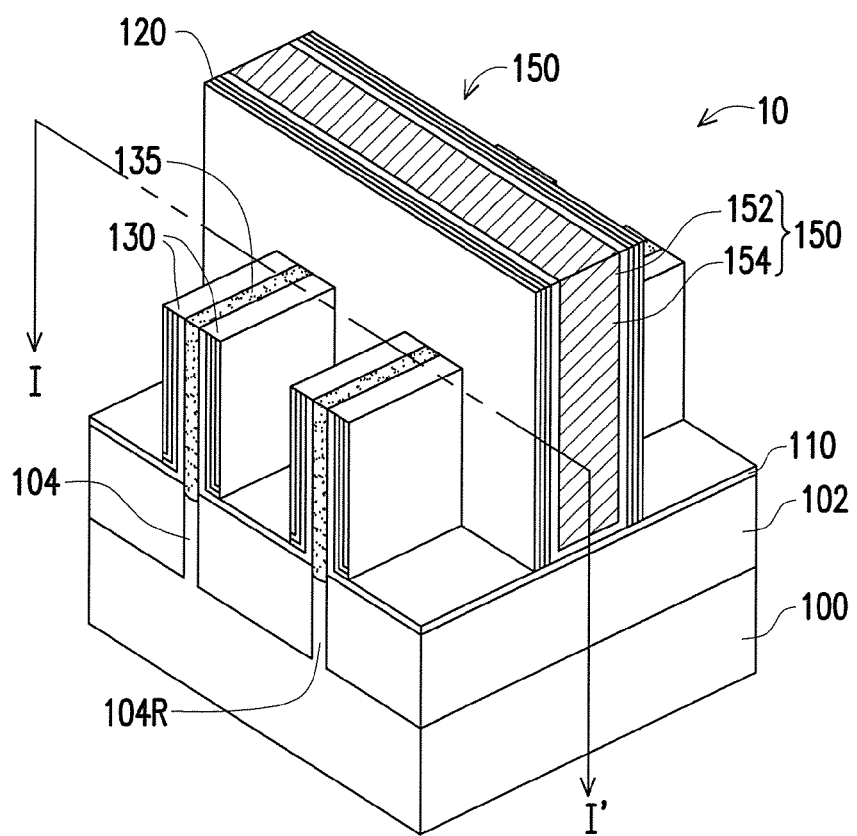
Figure 2K:
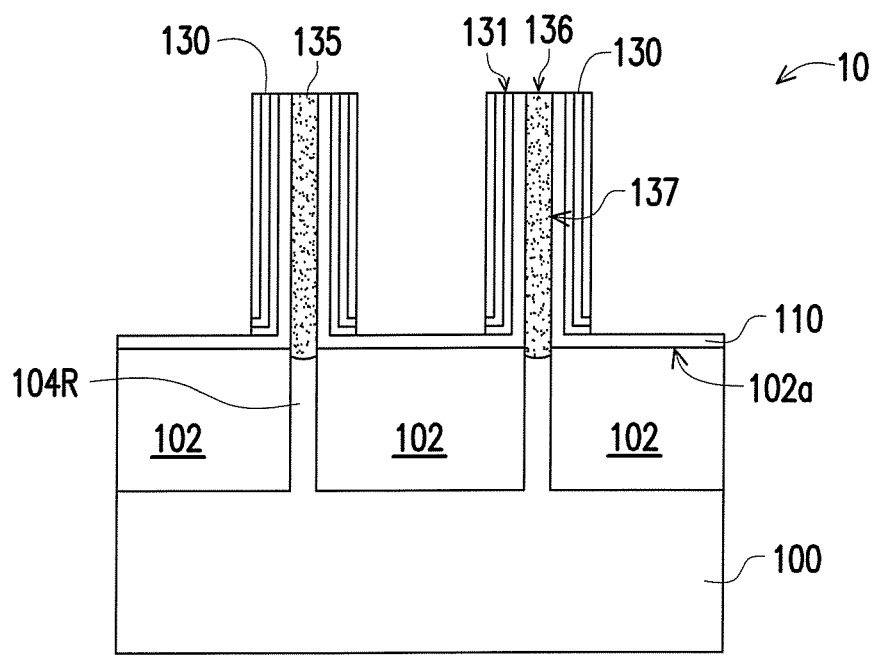

FIG. 2J is a perspective view of the FinFET 10 at one of various stages of the manufacturing method. FIG. 2K is an exemplary cross-sectional view of FIG. 2J along the cross-sectional line I-I'. In FIG. 2J & FIG. 2K, in some embodiments, the stack structure 115 (the hard mask strip 114 and the polysilicon strip 112) between the first spacers 120 is removed and a gate structure 150 is formed within the recess between the opposite first spacers 120. In one embodiment, the removal of the stack structure 115 includes performing one or more anisotropic etching processes, for example. The gate structure 150 includes a gate dielectric layer 152 and a gate electrode layer 154. In certain embodiments, the gate structure 150 is formed by depositing a gate dielectric layer 152 within the recess between the first spacers 120 and over the fins 104 (the channel regions) and the insulators 102, and then forming a gate electrode layer 154 on the gate dielectric layer 152 and filling the remaining recess between the first spacers 120. In some embodiments, the material of the gate dielectric layer 152 comprises silicon oxide, silicon nitride or the combination thereof. In some embodiments, the gate dielectric layer 152 comprises a high-k dielectric material, and the high-k dielectric material has a k value greater than about 7.0 and includes a metal oxide or a silicate of Hf, Al, Zr, La, Mg, Ba, Ti, Pb and combinations thereof. In some embodiments, the gate dielectric layer 152 is formed by atomic layered deposition (ALD), molecular beam deposition (MBD), CVD, PVD or thermal oxidation. In some embodiments, the gate electrode layer 154 comprises a metal-containing material, such as Al, Cu, W, Co, Ti, Ta, Ru, TiN, TiAl, TiAlN, TaN, TaC, NiSi, CoSi or a combination thereof. Depending on whether the FinFET 10 is a p-type FinFET or an n-type FinFET, the materials of the gate dielectric layer 152 and/or the gate electrode layer 154 are chosen. Optionally, in certain embodiment, a CMP process is performed to remove the excess portions of the gate structure 150. The first spacers 120 are remained and are located on sidewalls of the gate structure 150. In some embodiments described herein, the gate structure 150 is a replacement metal gate. Although the number of the gate structure is shown as one in FIG. 2J, it is understood that multiple gate structures may be formed, and the gate structure(s) or the fabrication processes thereof are not limited by these embodiments.

In FIG. 2J and FIG. 2K, in certain embodiments, the epitaxy material of the source and drain regions 135 filled between the second spacers 130 are not protruded from the top surfaces 131 of the second spacers 130, but the top surfaces 136 of the source and drain regions 135 are substantially coplanar with the top surfaces 131 of the second spacers 130. In some embodiments, during the removal of the stack structure 115 and the formation of the replacement gate structure, the protruded portions 135A of the epitaxy material in the source and drain regions 135 may be consumed so that the top surfaces 136 of the source and drain regions 135 are substantially coplanar with the top surfaces 131 of the second spacers 130. In alternative embodiments, some of the protruded portions 135A of the epitaxy material in the source and drain regions 135 remain so that the top surfaces 136 of the source and drain regions 135 are slightly higher than the top surfaces 131 of the second spacers 130. Optionally, the pad layer 110 may be removed following the formation of the gate structure 150. Subsequently, inter-dielectric layer(s) may be formed but will not be described in details herein.

In some embodiments described herein, because the source and drain regions 135 filled between the second spacers 130 are constrained by the second spacers 130, the epitaxy growth of the epitaxy material therein is stable and restrained from excessively lateral epitaxy over-growth or epitaxy merge. The stably formed epitaxy material of the source and drain regions 135 leads to better device performance as uniform stress is provided. The source and drain regions 135 disposed on different fins 104 are separate from each other, which is suitable for single fin transistor structure. Furthermore, the manufacturing method described in the above embodiments is suitable for fabricating the device with small fin pitch or spacing, as the source and drain regions will not merge among the closely arranged fins. In certain embodiments, the in-situ doping epitaxy material of the source and drain regions 135 further boost the doping of the fins 104, thus lowering the resistance. Accordingly, the resultant device can have better yield and less failure.

Figure 3:
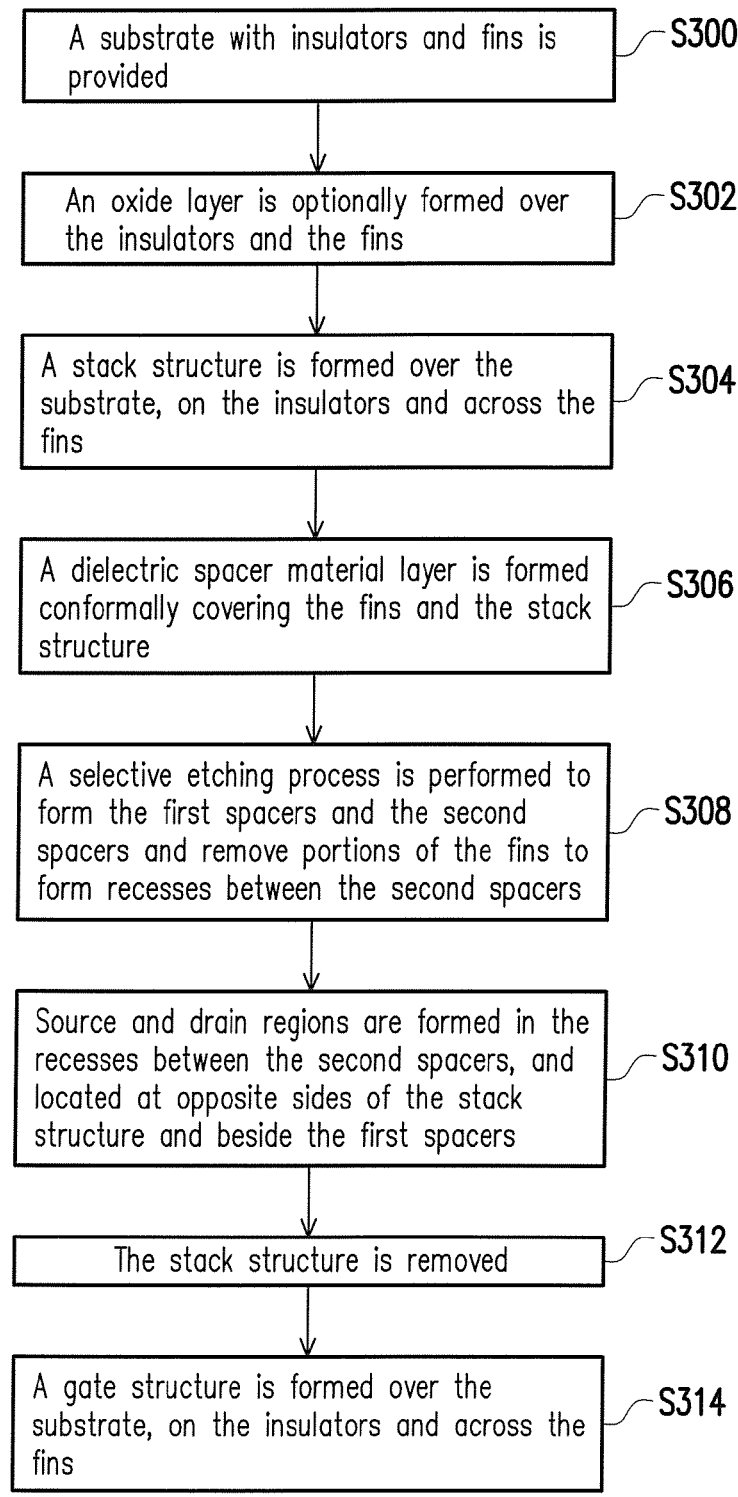
FIG. 3 is an exemplary flow chart showing the process steps of the manufacturing method for forming a FinFET in accordance with some embodiments of the present disclosure.

FIG. 3 is an exemplary flow chart showing some of the process steps of the manufacturing method for forming a FinFET in accordance with some embodiments of the present disclosure. In Step 300, a substrate with insulators and fins is provided. In Step 302, an oxide layer is optionally formed over the insulators and the fins. In Step 304, a stack structure is formed over the substrate, on the insulators and across the fins. In Step 306, a dielectric spacer material layer is formed conformally covering the fins and the stack structure. In Step 308, a selective etching process is performed to remove the dielectric spacer material layer to form the first spacers and the second spacers and remove portions of the fins to form recesses between the second spacers. In some embodiments, the dielectric spacer material layer is selectively and partially removed to form the first spacers remained on sidewalls of the stack structure and to expose the fins between the second spacers, and the selective etching process removed the fins between the second spacers. In Step 310, source and drain regions are formed in the recesses between the second spacers, and located at opposite sides of the stack structure and beside the first spacers. In Step 312, the stack structure is removed. In Step 314, a gate structure is formed over the substrate, on the insulators and across the fins.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In some embodiments of the present disclosure, a fin-type field effect transistor comprising a substrate, at least one gate structure, first spacers, second spacers and source and drain regions is described. The substrate has fins and insulators disposed between the fins. The at least one gate structure is disposed over the fins and disposed on the insulators. The first spacers are disposed on opposite sidewalls of the at least one gate structure. The source and drain regions are disposed on two opposite sides of the at least one gate structure and beside the first spacers. The second spacers are disposed on the two opposite sides of the at least one gate structure and beside the first spacers. The source and drain regions are sandwiched between the opposite second spacers.

In some embodiments of the present disclosure, a fin-type field effect transistor comprising a substrate, at least one gate structure, first spacers, second spacers and source and drain regions is described. The substrate has fins and trenches disposed between the fins, and insulators are located in the trenches and between the fins. The at least one gate structure is disposed over the fins and disposed on the insulators. The first spacers are disposed on opposite sidewalls of the at least one gate structure. The source and drain regions are disposed on two opposite sides of the at least one gate structure and beside the first spacers and disposed on the fins. The second spacers are disposed on the two opposite sides of the at least one gate structure and beside the first spacers. The second spacers are located on opposite sidewalls of the source and drain regions to sandwich the source and drain regions there-between and the source and drain regions located on the different fins are separate from one another.

In some embodiments of the present disclosure, a method for forming a fin-type field effect transistor is described. A substrate with fins and insulators located between the fins is provided. A stack structure is formed over the substrate, on the insulators and across the fins. A dielectric spacer material layer is formed conformally covering the fins and the stack structure. A selective etching process is performed to remove the dielectric spacer material layer to form first spacers beside the stack structure and second spacers on sidewalls of the fins and remove portions of the fins to form recesses between the second spacers. Source and drain regions are formed in the recesses between the second spacers. The source and drain regions are located at opposite sides of the stack structure and beside the first spacers. After removing the stack structure between the first spacers, a gate structure is formed between the first spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming a fin-type field effect transistor, comprising:
providing a substrate with fins and insulators located between the fins;

forming a stack structure over the substrate, on the insulators and across the fins;

forming a dielectric spacer material layer conformally covering the fins and the stack structure;

performing a selective etching process to remove the dielectric spacer material layer to form first spacers beside the stack structure and second spacers on sidewalls of the fins and expose portions of the fins and continuously followed by removing the exposed portions of the fins to form recesses between the second spacers in the same continuous selective etching process;

forming source and drain regions in the recesses between the second spacers, wherein the source and drain regions are located at opposite sides of the stack structure and beside the first spacers;

removing the stack structure between the first spacers; and forming a gate structure between the first spacers.

2. The method of claim 1, wherein performing the selective etching process comprises performing at least one atomic layer etching (ALE) process and the ALE process is performed to strip off the dielectric spacer material layer by mono atomic layer.

3. The method of claim 1, wherein performing the selective etching process comprises performing at least one quasi-atomic layer etching (quasi-ALE) process and the quasi-ALE process is performed to strip off one or several atomic-layers of the dielectric spacer material layer.

4. The method of claim 1, wherein performing the selective etching process to remove the dielectric spacer material layer comprises selectively and partially removing the dielectric spacer material layer to form the first spacers on sidewalls of the stack structure, removing the dielectric spacer material layer on top surfaces of the fins to form the second spacers and removing the fins between the second spacers to form the recesses between the second spacers.

5. The method of claim 1, wherein forming source and drain regions comprises forming an epitaxy material by performing a selective epitaxial growth process with in-situ doping.

6. The method of claim 5, wherein the epitaxy material includes silicon germanium (SiGe), boron-doped silicon germanium (SiGeB), silicon carbide (SiC), phosphorous-doped silicon carbide (SiCP) or silicon phosphide (SiP).

7. The method of claim 1, wherein forming the dielectric spacer material layer comprises forming more than one dielectric materials sequentially over the substrate to conformally cover the fins and the stack structure.

8. A method for forming a field effect transistor, comprising:

providing a semiconductor substrate;

patterning the semiconductor substrate to form fins and trenches;

forming insulators in the trenches and between the fins;

forming a stack structure over the semiconductor substrate, across the fins and on the insulators;

forming a dielectric spacer material layer covering the stack structure, the fins and the insulators;

removing the dielectric spacer material layer on the insulators, on a top surface of the stack structure and on top surfaces of the fins to form spacers and continuously recessing the fins exposed from the spacers to form recesses between the spacers through performing a single continuous selective etching process;

forming source and drain regions in the recesses, wherein the source and drain regions are located on the recessed fins and at opposite sides of the stack structure; and forming a gate structure to replace the stack structure.

9. The method of claim 8, wherein performing the single selective etching process comprises performing atomic layer etching (ALE) to strip off the dielectric spacer material layer by mono atomic layer.

10. The method of claim 8, wherein performing the single selective etching process comprises performing quasi-atomic layer etching (quasi-ALE) to strip off one or several atomic-layers of the dielectric spacer material layer.

11. The method of claim 8, further comprising forming a pad layer over the semiconductor substrate conformally covering the fins and the insulators before forming the stack structure.

12. The method of claim 8, wherein removing the dielectric spacer material layer includes removing the dielectric spacer material layer on the insulators, removing the dielectric spacer material on the top surface of the stack structure to form first spacers on sidewalls of the stack structure and removing the dielectric spacer material on the top surfaces of the fins to form second spacers on sidewalls of the fins.

13. The method of claim 12, wherein recessing the fins exposed from the spacers to form recesses comprises etching the exposed fins sandwiched between the second spacers until bottom surfaces of the recesses lower than top surfaces of the insulators.

14. The method of claim 8, further comprising performing a gradient implantation process to dope the recessed fins after recessing the exposed fins.

15. The method of claim 8, wherein forming source and drain regions comprises forming an epitaxy material by performing an epitaxial growth process with in-situ doping.

16. A method for forming a field effect transistor, comprising:

providing a semiconductor substrate having fins and insulators between the fins;

forming a stack structure over the semiconductor substrate, across the fins and on the insulators;

forming a dielectric spacer material layer over the stack structure, over the fins and on the insulators;

selectively removing the dielectric spacer material layer on the insulators, on a top surface of the stack structure and on top surfaces of the fins to form spacers and continuously recessing the fins that are exposed from and sandwiched between the spacers to form recesses in the fins through performing a single continuous selective etching process;

forming epitaxy material portions in the recesses, wherein the epitaxy material portions are located on the recessed fins and at opposite sides of the stack structure; and forming a gate structure to replace the stack structure.

17. The method of claim 16, wherein forming epitaxy material portions in the recesses comprises forming an epitaxy material filling the recesses by performing an epitaxial growth process with in-situ doping.

18. The method of claim 17, further comprising doping the recessed fins following forming epitaxy material portions in the recesses.

19. The method of claim 16, further comprising forming a pad layer over the semiconductor substrate conformally covering the fins and the insulators before forming the stack structure.

20. The method of claim 19, wherein selectively removing the dielectric spacer material layer comprises removing the pad layer located on the top surfaces of the fins, and recessing the fins that are exposed from and sandwiched between the spacers to form recesses in the fins comprises etching the exposed fins without removing the pad layer sandwiched between the fins and the second spacers until bottom surfaces of the recesses lower than the pad layer located on the insulators.

\* \* \* \* \*